United States Patent [19]

Frank et al.

[11] 4,449,105
[45] May 15, 1984

[54] PASSIVE MASER USING TIMESHARING FOR CONTROL OF THE CAVITY AND CONTROL OF THE OSCILLATOR ON THE LINE OF STIMULATED EMISSION

[75] Inventors: Alick H. Frank, Springfield; Joseph D. White, Alexandria, both of Va.

[73] Assignee: The United States of America as represented by the Secretary of the Navy, Washington, D.C.

[21] Appl. No.: 265,129

[22] Filed: May 19, 1981

[51] Int. Cl.³ .............................................. H03L 7/26
[52] U.S. Cl. ...................................... 331/3; 331/94.1
[58] Field of Search ................................... 331/3, 94.1

[56] References Cited

U.S. PATENT DOCUMENTS

| 4,290,030 | 9/1981 | Wang | 331/3 |
| 4,316,153 | 8/1982 | Busca et al. | 331/94.1 |
| 4,326,174 | 4/1982 | Busca et al. | 331/3 |

OTHER PUBLICATIONS

F. L. Walls, "Design and Results from a Prototype Passive Hydrogen Maser Frequency Standard," Proc. 8th Ann. Precise Time and Time Interval (PTTI) Planning Meeting, 369, 1976.
F. L. Walls and D. A. Howe, "A Passive Hydrogen Maser Frequency Standard," Proc. 32ne Ann. Symp. on Freq. Control, 492, 1978.
F. L. Walls and H. Hellwig, "A New Kind of Passively Operating Hydrogen Frequency Standard," Proc. 30th Ann. Symp. on Freq. Control, 473, 1976.
F. L. Walls, U.S. Patent Application Ser. No. 851,326 (Filed Nov. 14, 1977), Available to Public as N.T.I.S. Report PB-277689.

Primary Examiner—Siegfried H. Grimm
Attorney, Agent, or Firm—Robert F. Beers; William T. Ellis; Alan P. Klein

[57] ABSTRACT

A passive maser wherein control of the cavity and control of the oscillator on the line of stimulated emission operate in a shared-time mode. A control circuit acts on the injected signal by way of a programmable synthesizer, the injected signal then assuming the successive values $\omega_L{}^+$, $\omega_H$, $\omega_H$ and $\omega_C{}^+$, $\omega_H$ and $\omega_C{}^-$, $\omega_L{}^-$, $\omega_L{}^+$, etc. in stages. $\omega_H$ is centered at the line of stimulated emission $\omega_L{}^+$ and $\omega_L{}^-$ which are symmetrically shifted interrogate the sides of the emission line; and $\omega_C{}^+$ and $\omega_C{}^-$ which are further symmetrically shifted interrogate the sides of the cavity resonance. The control circuit periodically inhibits the detection action used for controlling the oscillator, and the detection action used for controlling the cavity is carried out only during the inhibition period.

14 Claims, 10 Drawing Figures

PASSIVE MASER USING TIMESHARING FOR CONTROL OF THE CAVITY AND CONTROL OF THE OSCILLATOR ON THE LINE OF STIMULATED EMISSION

BACKGROUND OF THE INVENTION

This invention relates to a passive maser and a process for controlling a passive maser.

U.S. Pat. No. 4,122,408 issued to F. L. Walls discloses a system and method for achieving frequency stabilization of a passive maser so that the maser can form a frequency standard. A local oscillator provides a carrier signal which is phase or frequency modulated by a pair of modulating signals, and the multiple modulated carrier signal is then processed and the resulting probe signal coupled to the maser cavity substantially at a frequency close to the natural frequency of the atomic resonance line (e.g., hydrogen) internal to the cavity. The output signal coupled from the cavity is amplitude modulated, with the modulation at the first modulation frequency having a level proportional to any frequency offset between the probe signal and the atomic resonance line, and the modulation at the second modulation frequency having a level proportional to any frequency offset between the resonant frequency of the cavity and the frequency of the probe signal. The output signal from the cavity is processed and utimately rectified so that the various amplitude modulations on the output signal can be recovered. The error signal resulting from synchronous detection of the amplitude modulation signal of the second frequency, is coupled to the tuning element of the cavity tuning control circuitry to precisely tune the resonant frequency of the cavity to the frequency of the probe signal. The error signal resulting from synchronous detection of the amplitude modulation signal of the first frequency is coupled to the local oscillator to adjust the frequency so that the probe signal is maintained at the center of the atomic resonance line. In this manner, the resonant frequency of the cavity and the local probe signal are stabilized to the atomic resonance line, thereby also stabilizing the local oscillator.

The major shortcomings of this system are that the harmonic content of the probe modulation signal must be very low and that the timing of the servo circuits is critical. Thus, precision analog adjustments are required for setup and must be repeated at intervals throughout the life of the frequency standard. This is particularly disadvantageous when the maser is to be used as a frequency standard on an orbiting spacecraft, where adjustments of this nature are not practical.

SUMMARY OF THE INVENTION

Accordingly, it is an object of the present invention to achieve frequency stabilization of a passive maser so that the maser can form a frequency standard.

Another object is to use digital circuitry to achieve such frequency stabilization.

These and other objects of the present invention are achieved by a passive maser and a process for controlling the passive maser. The passive maser has a resonant cavity which contains a medium capable of stimulated emission and which is excited by an injected signal. A first error signal representing the difference between the carrier frequency of the injected signal and the frequency of the stimulated emission is produced from a signal picked off from the cavity and is used to adjust the carrier frequency. A second error signal representing the difference between the resonant frequency of the cavity and the carrier frequency is produced from the picked-off signal and used to adjust the resonant frequency. Production of the second error signal is periodically inhibited and the first error signal is produced only during the inhibition periods.

The invention makes it possible to provide a passive maser having a degree of stability which is markedly better than that of a conventional passive maser such as that described in the above-cited patent application. The control system of the passive maser has a high percentage of digital circuits. The digital circuits reduce the necessity for analog adjustments, and offer the advantages of low power consumption, reduced weight, compactness, and a broad environmental operating range. These features are ideal for space applications.

Additional advantages and features will become apparent as the subject invention becomes better understood by reference to the following detailed description when considered in connection with the accompanying drawings wherein:

DESCRIPTION OF THE PREFERRED EMBODIMENT

Figure 1:
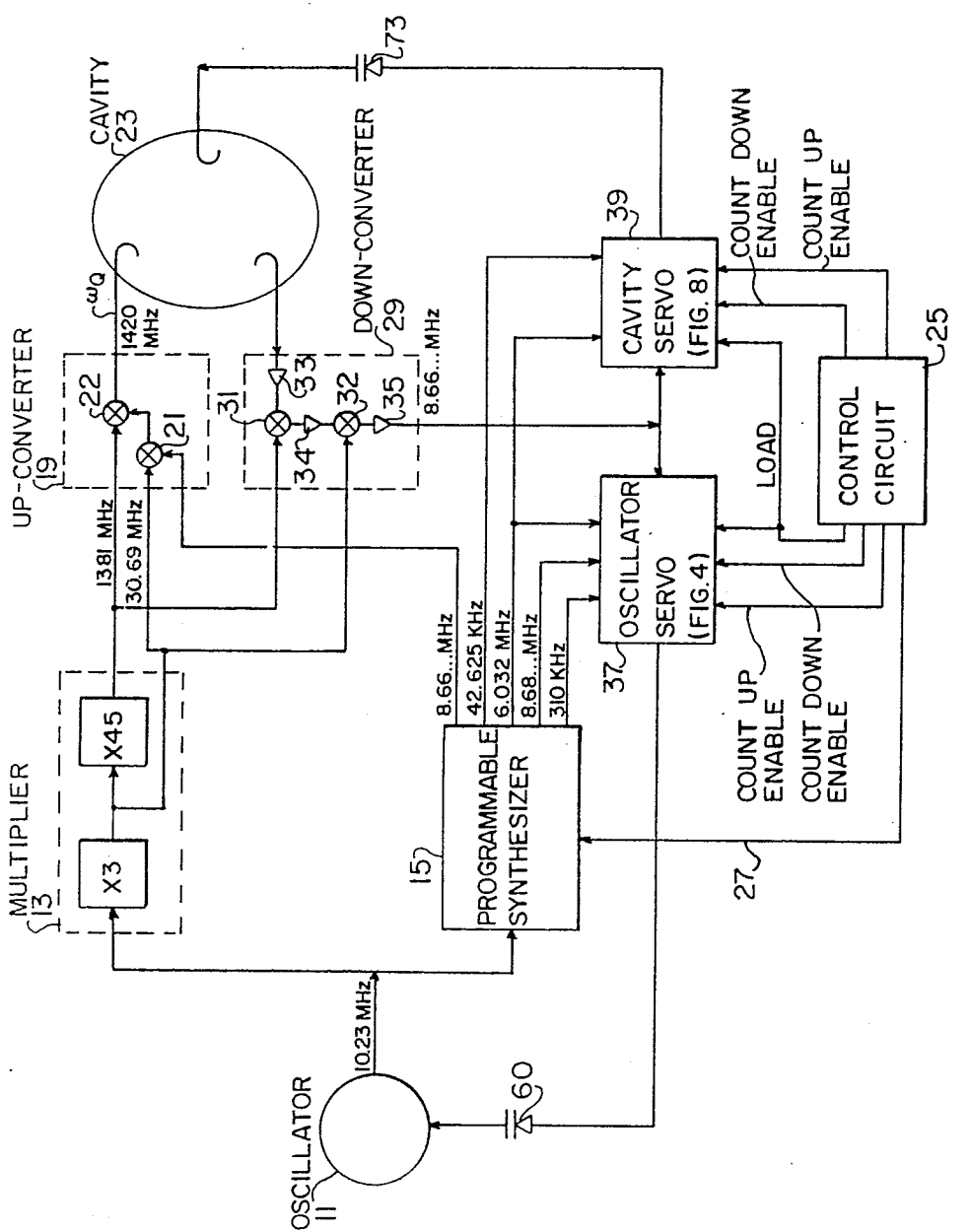
FIG. 1 is a block diagram of an illustrative maser embodying the invention.

FIG. 1 is a diagrammatic view of the passive maser. An oscillator 11 produces a signal at a frequency of 10.23 MHz. This signal is applied to a multiplier 13 and also to a frequency synthesizer 15. The synthesizer 15 is a programmable synthesizer which generates a frequency modulated output signal in the region of 8.66 . . . MHz. This frequency is applied to an up-converter 19 where it is mixed successively in mixers 21 and 22 with 30.69 MHz and 1381 MHz provided by the multiplier 13 to give a signal having a frequency $\omega_Q = \omega_H$ where $\omega_H$ is a frequency close to 1420 MHz, which is introduced into the cavity 23.

The resonant cavity 23 is tuned to the natural frequency of the line H of the stimulated emission of the medium which it contains. In the case of a hydrogen maser, the transition which gives rise to the stimulated emission is the transition from the state $F=1$, $m_F=0$, to the state $F=0$, $m_F=0$, of a hydrogen atom which is placed in a magnetic field for separating the Zeeman sub-levels $m_F = +1$ and $m_F = -1$ from the state $m_F = 0$.

The natural frequency of this transition is in the region of 1420 MHz (1420.405751 ... MHz).

The cavity 23 can be considered as a band pass filter whose coefficient $Q_C$ varies between 5000 and 20,000, depending on the volume of the cavity. For a coefficient of the order of 10,000, the cavity with the medium which it contains can be considered as a combination of such a filter with a filter having a quality factor $Q_H$ of the order of $7 \times 10^8$.

The output frequency of the programmable synthesizer 15 depends on digital signals from a conventional control circuit 25 by way of a line 27. Any variation in the output frequency of the synthesizer 15 results in an equal variation in the injected frequency $\omega_Q$. The control circuit 25 can therefore modulate $\omega_Q$ about its carrier frequency $\omega_H$ in order to interrogate the stimulated emission line H and the resonance curve of the cavity 23.

Figure 2:
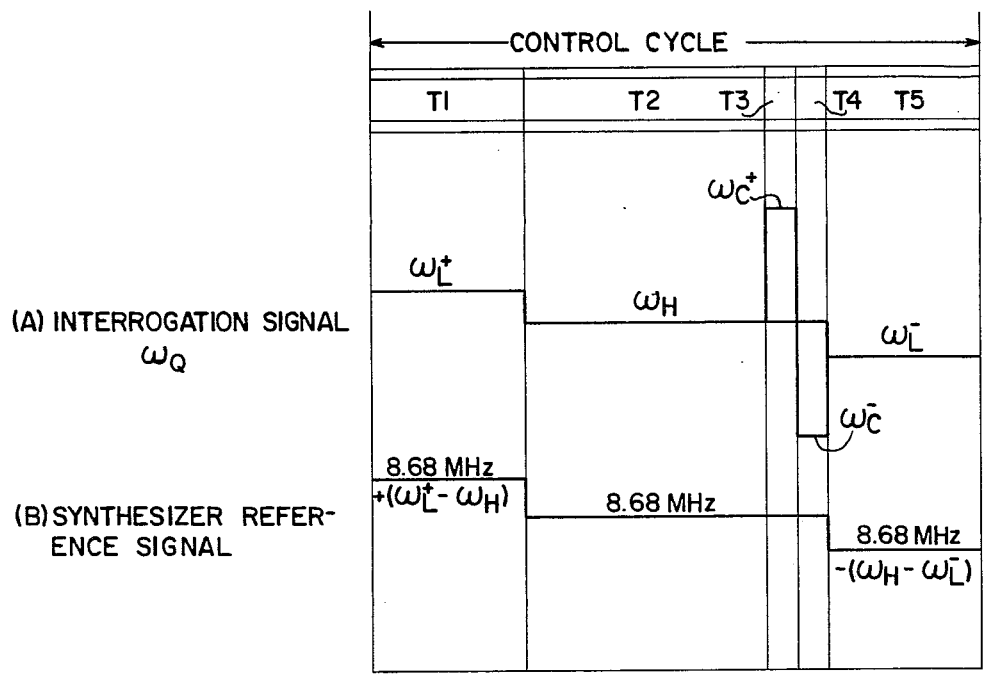
FIGS. 2(A) and 2(B) are timing diagrams showing the mode of operation of the maser shown in FIG. 1.

The control circuit 25 is so arranged that the frequency $\omega_Q$ behaves as shown in FIG. 2 (A) and successively assumes the indicated values $\omega_L{}^+$, $\omega_H$, $\omega_H$ and $\omega_C{}^+$, $\omega_H$ and $\omega_C{}^-$, $\omega_L{}^-$, $\omega_L{}^+$, etc.

Figure 3:
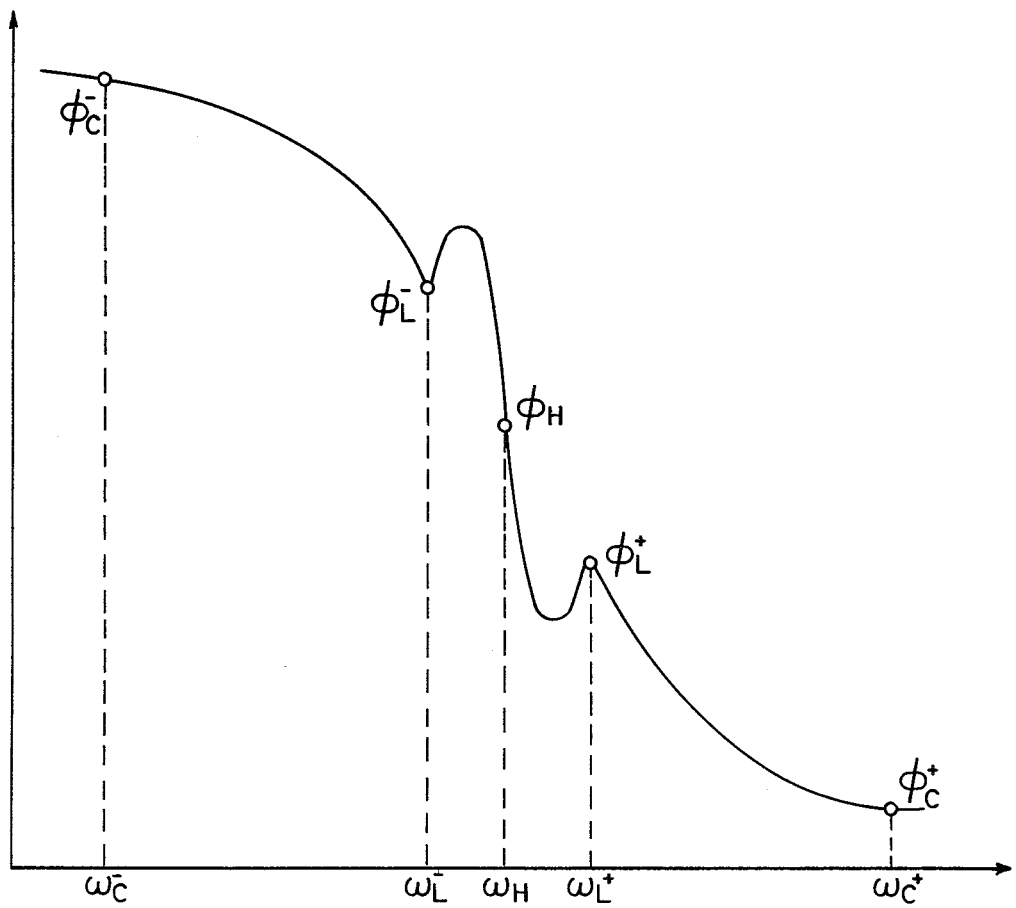
FIG. 3 shows the dispersion curve of the cavity and stimulated emission line for the on-resonance condition.

Referring to FIG. 3 which shows the dispersion curve of the stimulated emission line H and the cavity, the carrier frequency $\omega_H$ is an approximation to the central frequency of the line H. $\phi_H$ denotes the phase at the cavity output for the frequency $\omega_H$ measured relative to an arbitrary reference phase. $\omega_L{}^+$ and $\omega_L{}^-$ are a first set of frequencies which are displaced equally on respective sides of the carrier frequency $\omega_H$ so as to coincide with points on the dispersion curve well outside the width of the line H but still near the center of the cavity resonance width. The difference between $\omega_L{}^+$ and $\omega_L{}^-$ is of the order of 500 Hz. $\phi_L{}^+$ and $\phi_L{}^-$ here denote the phases at the cavity output for the frequencies $\omega_L{}^+$ and $\omega_L{}^-$ respectively, measured relative to the arbitrary reference phase. $\omega_C{}^+$ and $\omega_C{}^-$ are a second set of frequencies which are displaced equally on respective sides of the carrier frequency $\omega_H$ so as to coincide with the points on the dispersion curve away from line H but within the passband of the cavity resonance. The difference between $\omega_C{}^+$ and $\omega_C{}^-$ is of the order of 85 KHz. $\phi_C{}^+$ and $\phi_C{}^-$ here denote the phases at the cavity output for the frequencies $\omega_C{}^+$ and $\omega_C{}^-$ respectively, measured relative to the arbitrary reference phase.

Referring again to FIG. 2 (A), the frequency $\omega_Q$ of the interrogation signal is varied according to: State T1 (1 second): shifted in a first direction to $\omega_L{}^+$.

State T2 (1.7 seconds): maintained at the carrier value $\omega_H$.

State T3 (0.15 seconds): split into two components, one at the carrier value $\omega_H$, the other shifted in the first direction to $\omega_C{}^+$.

State T4 (0.15 seconds): split into two components, one at the carrier value $\omega_H$, the other shifted in a direction opposite to the first to $\omega_C{}^-$.

State T5 (1 second): shifted in the direction opposite to the first to $\omega_L{}^-$.

The cycle is then repeated.

Referring to FIG. 1, the output of the cavity 23, which is in the region of 1420 ... MHz is applied to a down-converter 29 where it is successively mixed in mixers 31 and 32 with 1381 MHz and 30.69 MHz. provided by the multiplier 13 and passed through amplifying bandpass filters 33–35 to give a frequency in the region of 8.66 ... MHz. The latter frequency is applied on the one hand to the servo 37 of the oscillator 11, and on the other hand to the servo 39 of the cavity 23.

Figure 4:
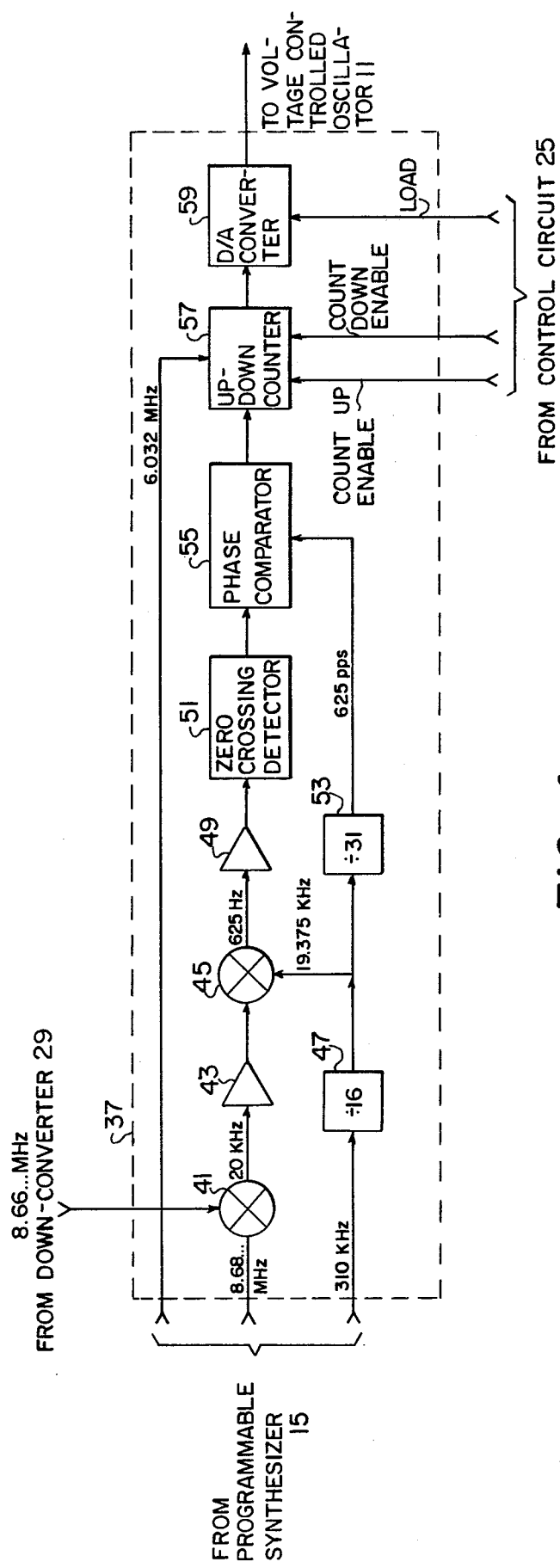
FIG. 4 is a detailed diagram of the oscillator servo of the maser shown in FIG. 1.
Figure 5:
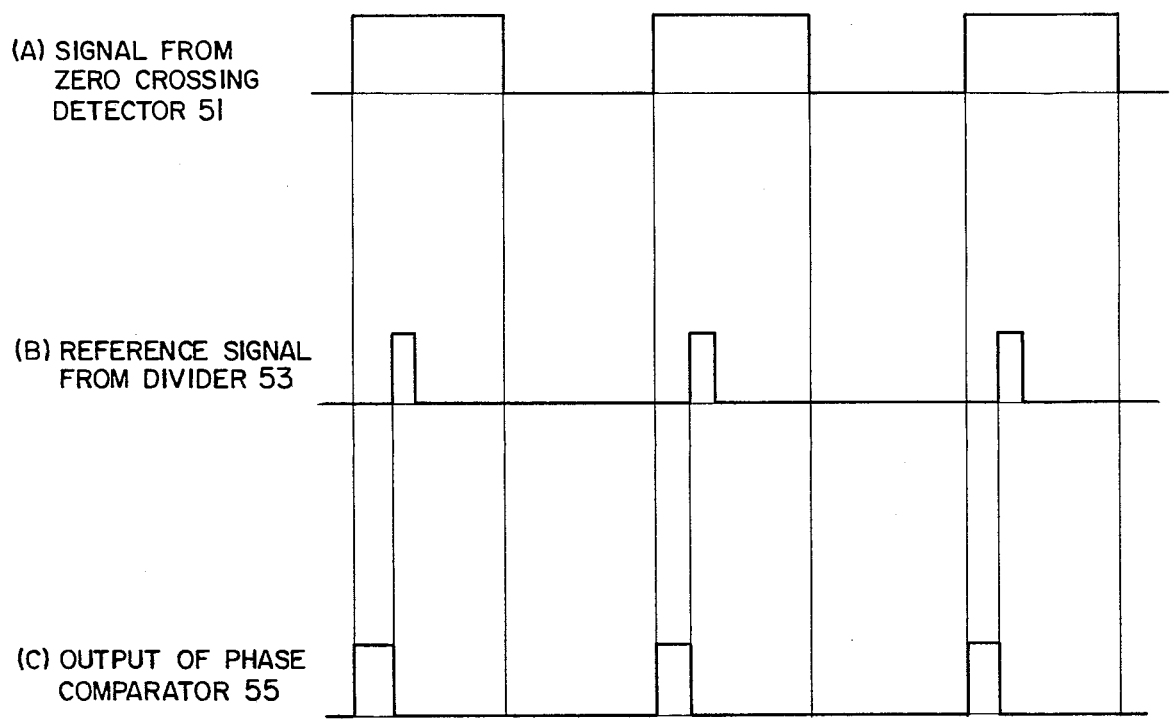
FIG. 5 is a timing diagram showing the mode of operation of the oscillator servo shown in FIG. 4.

Referring to FIG. 4 for the operation of the oscillator servo 37, the 8.66 ... MHz signal is mixed in a mixer 41 with an 8.68 ... MHz reference signal, whose frequency behaves as shown in FIG. 2(B), provided by the synthesizer 15, to give a fixed frequency of 20 kHz that preserves the phase of the output frequency of the cavity 23. The 20 kHz signal is passed through an amplifying bandpass filter 43 and mixed in a mixer 45 with 19.375 kHz derived from a divider 47 by dividing down 310 kHz provided by synthesizer 15 to give a 625 Hz signal which preserves the phase of the output frequency of the cavity 23. The 625 Hz. signal is passed through another amplifying bandpass filter 49 and a zero-crossing detector 51 to provide square edges for digital processing. This square wave signal, whose waveform is shown in line A of FIG. 5 is phase-compared in a comparator 55 with a 625 pulse-per-second reference signal, whose waveform is shown in line B of FIG. 5, that is provided from a divider 53 by further dividing down the 310 kHz signal from the synthesizer 15. The output of the phase comparator 55, whose waveform is shown in line C of FIG. 5 is a 625 pulse-per-second signal having a pulse width proportional to the phase difference of the two input signals, i.e., the phase of the frequency $\omega_Q$ at the cavity output measured relative to the arbitrary reference.

Figure 7:
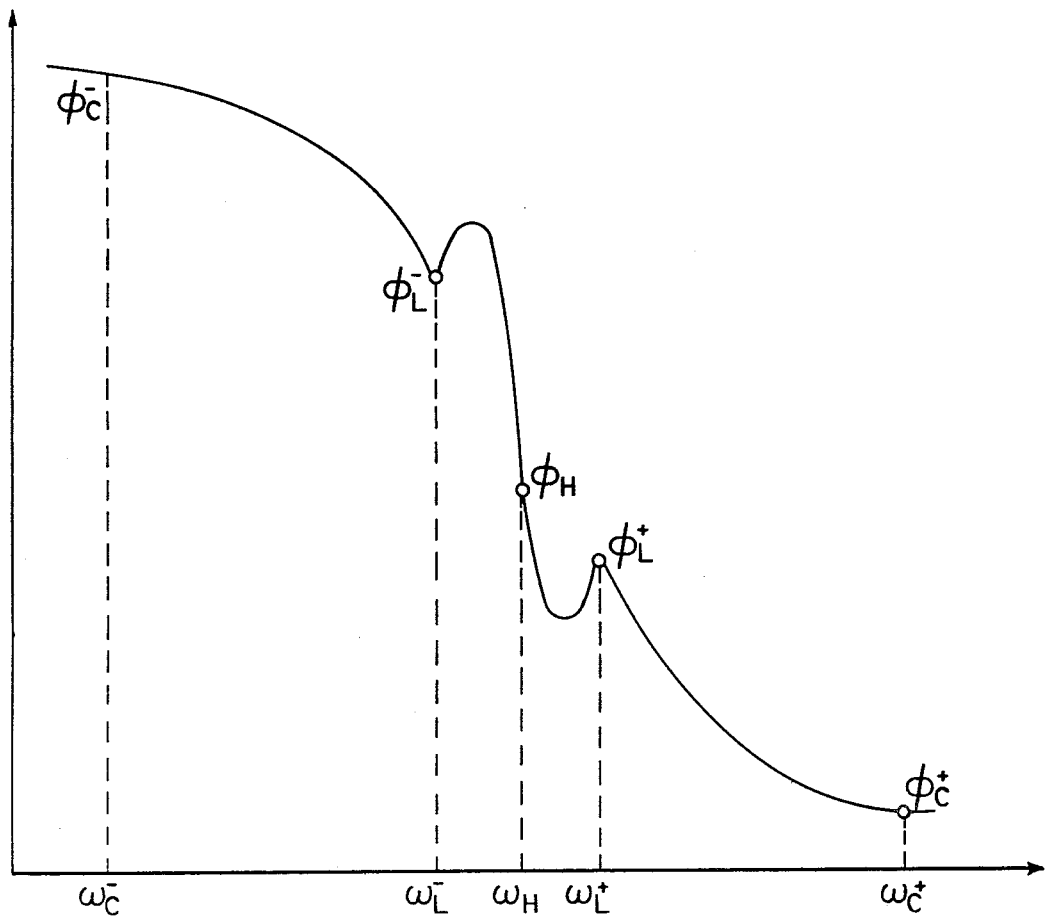
FIG. 7 shows the dispersion curve of FIG. 3 for the off-resonance condition.

The phase comparator output gates an up-down counter 57 which is clocked by 6.032 MHz provided by the synthesizer 15. The counter count-up and count-down inputs are enabled by digital control signals from the control circuit 25 by way of the COUNT UP ENABLE and COUNT DOWN ENABLE lines. The waveforms of the oscillator servo 37 count-up and count-down enable signals are shown in line A and line B of FIG. 6 respectively. During state T1, following a settling time d=0.32 seconds, the count-up input of the counter 57 is enabled for a time h=0.64 seconds, allowing gated bursts of 6.032 MHz. pulses to accumulate in the counter 57. The number of pulses accumulated in the counter 57 at the end of T1 is directly proportional to $\phi_L{}^+$ (the phase of $\omega_Q$ during T1). During state T2, following a settling time d, the count-down input of the counter 57 is enabled for a time 2h, allowing gated bursts of 6.032 MHz pulses to subtract from the pulses accumulated in the counter during T1. The number of pulses accumulated in the counter 57 at the end of state T2 is proportional to $\phi_L{}^+ - 2\phi_H$ (where $\phi_H$ is the phase of $\omega_Q$ during T2). During T3 and T4, the counter 57 is disabled. During state T5, after a settling time d, the count-up input of the counter 57 is again enabled for a time h, allowing gated bursts of 6.032 MHz pulses to accumulate in the counter. The number of pulses accumulated in the counter 57 at the end of T5 is proportional to $\phi_L{}^+ - 2\phi_H + \phi_L{}^-$ (where $\phi_L{}^-$ is the phase of $\omega_Q$ during T5). The count of the counter 57 when $\omega_H$ coincides with the central frequency of the line H (oscillator on resonance) is shown in line C of FIG. 6. The count of the counter 57 when $\omega_H$ is offset from the central frequency of the line H (oscillator off resonance) is shown in line D of FIG. 6. If $\omega_H$ coincides with the central frequency of the line H, then referring to FIG. 3 it is evident that $2\phi_H = \phi_L{}^+ + \phi_L{}^-$, and the final count is equal to the initial count in the counter 57. If $\omega_H$ does not coincide with the central frequency of the line H, as shown for example in FIG. 7, $2\phi_H$ is not equal to $\phi_L{}^+ + \phi_L{}^-$. Then the final count is greater or less than the initial count depending on whether $\omega_H$ is less than or greater than the central frequency of the line H, and the differential count is proportional to the frequency offset. (Since the slope of the dispersion curve ($d\phi/d\omega$) is constant near the line H, it follows that anything proportional to the phase offset $d\phi$ must be proportional to the frequency offset $d\omega$).

Figure 6:
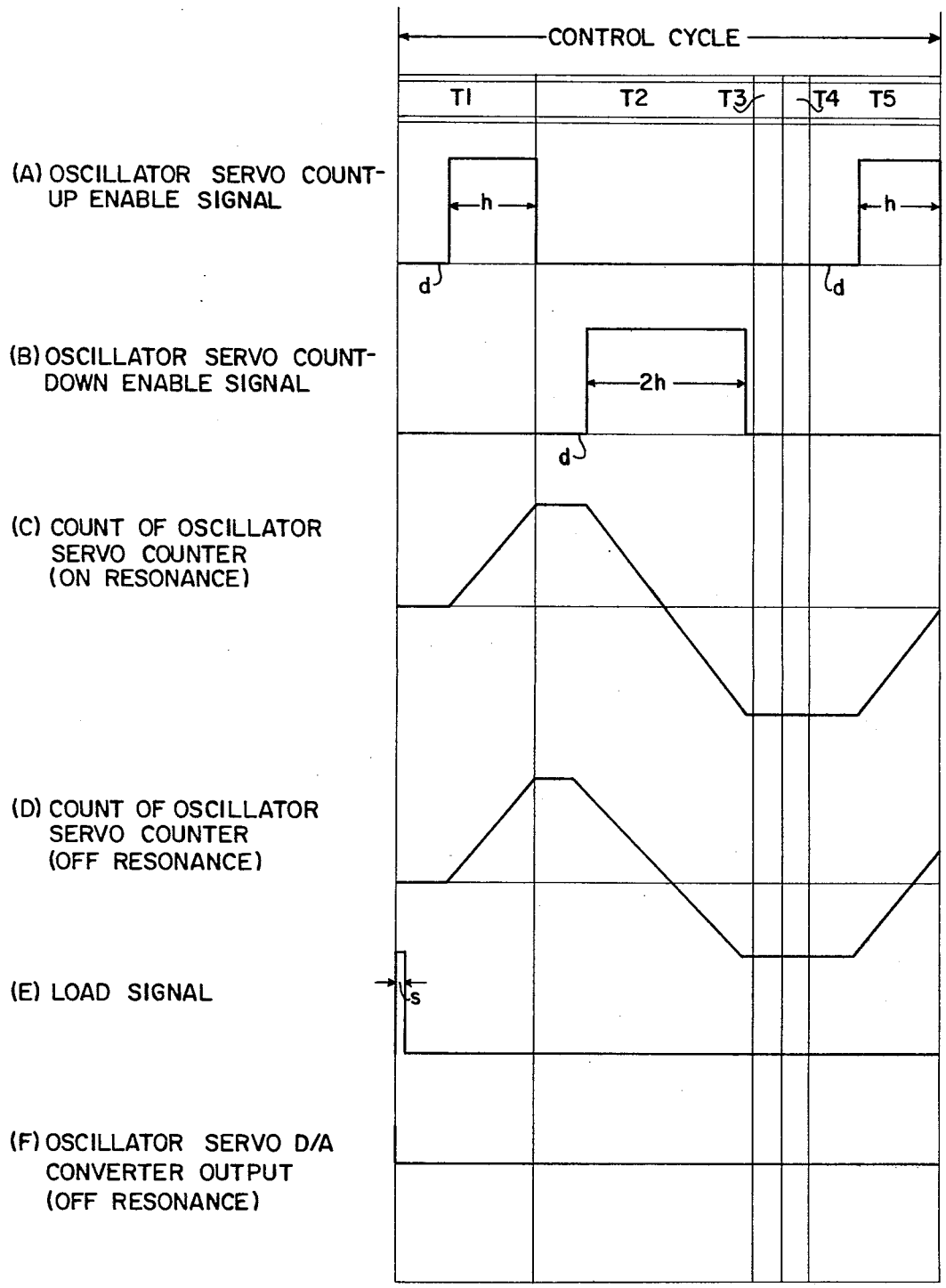
FIG. 6 is a further timing diagram showing the mode of operation of the oscillator servo shown in FIG. 4.

During the settling time d of state T1 of the next cycle, a digital-to-analog converter 59 is triggered by a pulse of width S=32 msec., whose waveform is shown in line E of FIG. 6, provided on the LOAD line from the control circuit 25. The converter 59 converts the count of the counter 57 to an analog error signal which is used for controlling a variable capacitor 60 which is coupled to the oscillator 11 whereby the frequency of the oscillator may be slightly varied for correction thereof. The output of the converter 59, whose waveform is shown in line F of FIG. 6, is scaled to reduce the frequency offset between the carrier frequency $\omega_H$ of the injected signal and the frequency of the stimulated emission. The scaling factor can be chosen to integrate the changes in the voltage applied to the variable capacitor 60.

Figure 8:
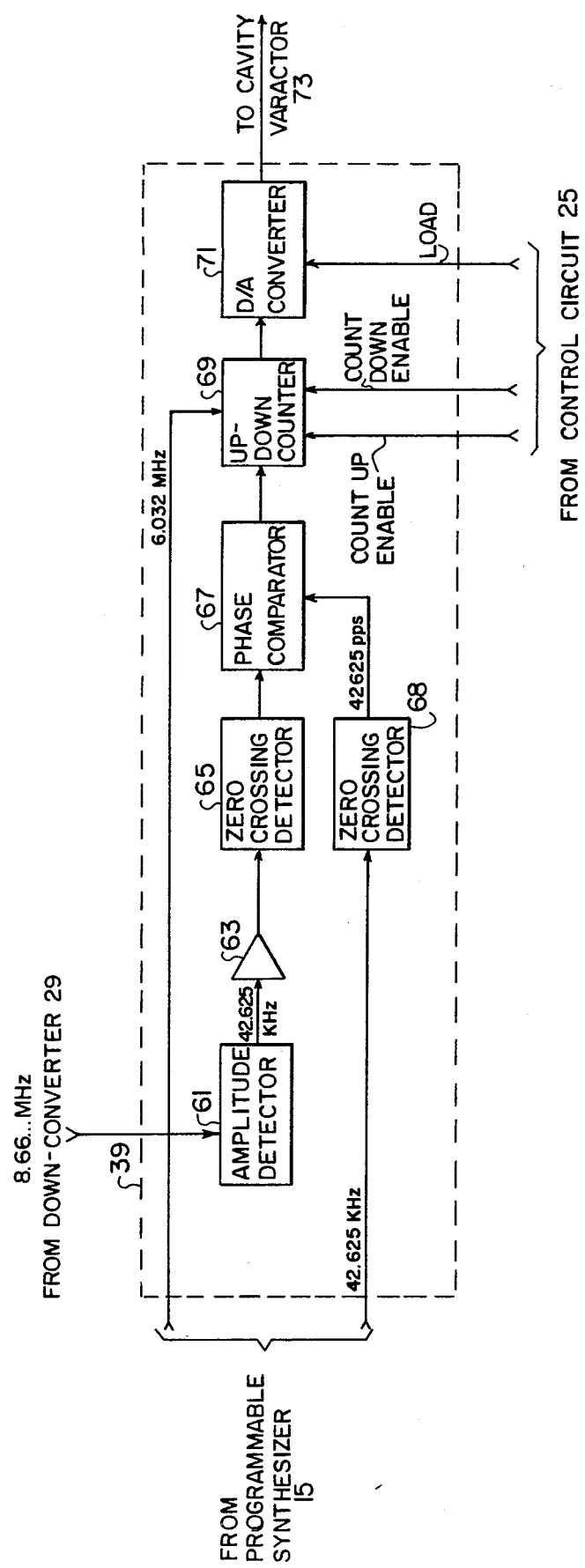
FIG. 8 is a detailed diagram of the cavity servo of the maser shown in FIG. 1.

Referring to FIG. 8 for the operation of the cavity servo 39, the 8.66 . . . MHz signal is detected by an amplitude detector 61 to give a 42.625 kHz signal during states T3 and T4 which is the beat signal of the two simultaneous components of the carrier frequency $\omega_Q$ and whose phase equals their phase difference at the output of the cavity. The 42.625 kHz signal is passed through an amplifying bandpass filter 63 and a zero crossing detector 65 to provide square waves for digital processing. This square wave signal is phase-compared in a phase comparator 67 with a 42,625 pulse-per-second reference signal provided by passing 42.625 kHz from the synthesizer through a zero crossing detector 68. The output of the phase comparator 67 during states T3 and T4 is a 42,625 pulse-per-second signal having a pulse width proportional to the phase difference of the two input signals, i.e., the difference between the phases of the two simultaneous components of the frequency $\omega_Q$ at the cavity output measured relative to the arbitrary reference.

Figure 9:
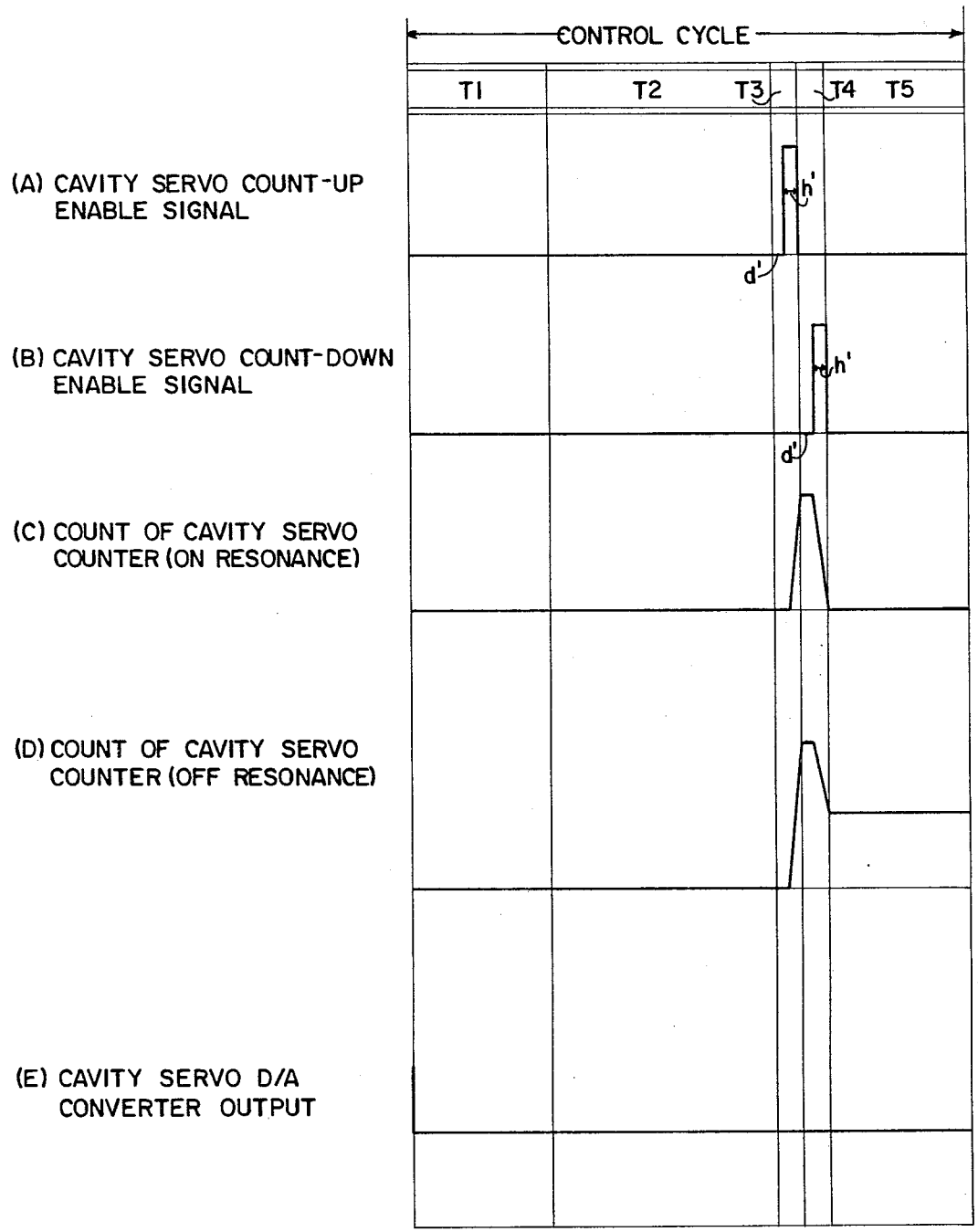
FIG. 9 is a timing diagram showing the mode of operation of the cavity servo shown in FIG. 8.
Figure 10:
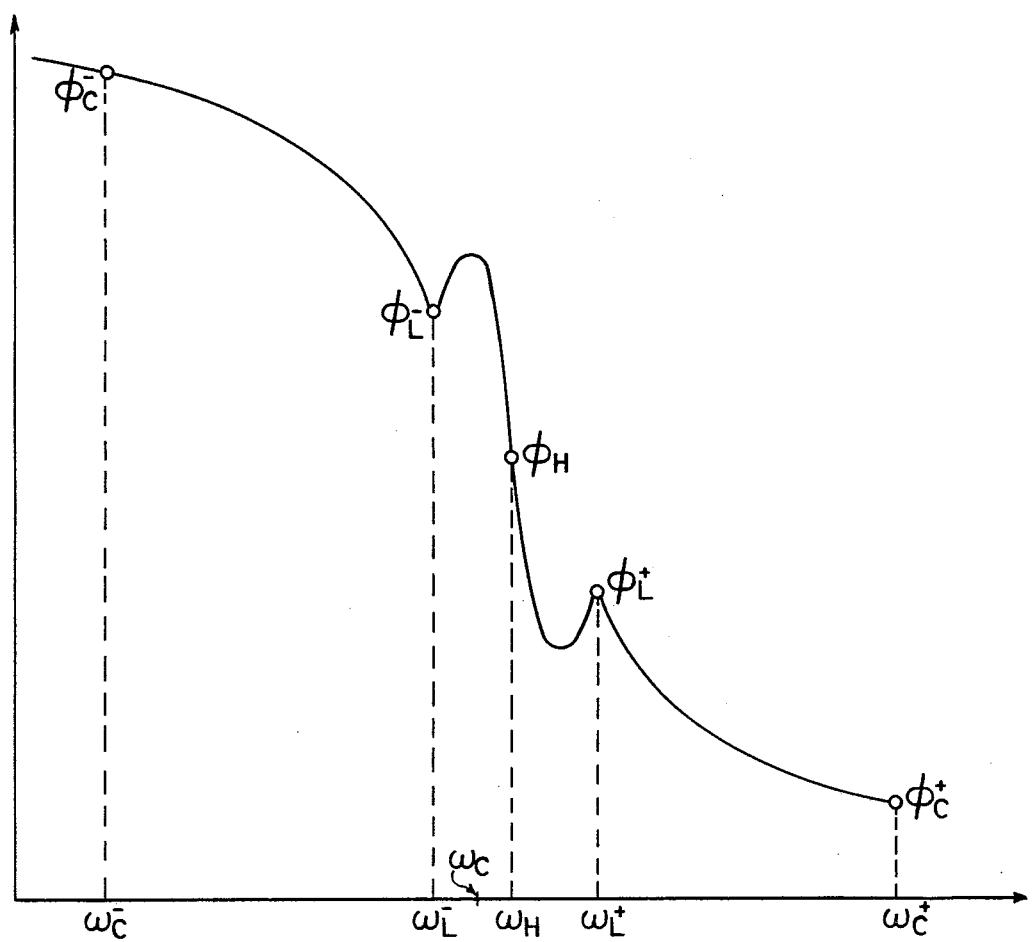
FIG. 10 shows the dispersion curve of FIG. 3 for the off-resonance condition.

The phase comparator 67 output gates an up-down counter 69 which is clocked by 6.032 MHz. provided by the synthesizer 15. The counter count-up and count-down inputs are enabled by digital control signals from the control circuit 25 by way of the COUNT UP ENABLE and COUNT DOWN ENABLE lines. The waveforms of the cavity servo 39 count-up and count-down enable signals are shown in lines A and B of FIG. 9 respectively. During T1 and T2, the counter 69 is disabled. During T3, the count-up input of the counter 69 is enabled for a time h'=73 msec. after a settling time d'=73 msec., allowing gated bursts of 6.032 MHz pulses to accumulate in the counter. The number of pulses accumulated in the counter at the end of T3 is directly proportional to $\phi_C^+ - \phi_H$ (where $\phi_C^+$ and $\phi_H$ are the phases of $\omega_Q$ during T3). During state T4, the count-down input of the counter 69 is enabled for a time h' after a settling time d', allowing gated bursts of 6.032 MHz pulses to subtract from the pulses accumulated in the counter during T3. The number of pulses accumulated in the counter at the end of state T4 is proportional to $\phi_C^+ - \phi_H - (\phi_H - \phi_C^-) = \phi_C^+ - 2\phi_H + \phi_C^-$ (where $\phi_C^-$ and $\phi_H$ are the phases of $\omega_Q$ during T4). During T5, the counter 69 is disabled. The count of the counter 69 when the resonance frequency $\omega_C$ of the cavity coincides with $\omega_H$ (cavity on resonance) is shown in line C of FIG. 9. The count of the counter 69 when the resonance frequency $\omega_C$ of the cavity is offset from $\omega_H$ (cavity off resonance) is shown in line D of FIG. 9. If $\omega_C$ coincides with $\omega_H$, then $2\phi_H = \phi_C^+ + \phi_C^-$, and the final count is equal to the initial count in the counter 69. If $\omega_C$ does not coincide with $\omega_H$, as shown for example in FIG. 10, $2\phi_H$ is not equal to $\phi_C^+ + \phi_C^-$. Then the final count is greater or less than the initial count depending on whether $\omega_C$ is less than or greater than $\omega_H$, and the differential count is proportional to the frequency offset.

During the settling time d of state T1 of the next cycle, a digital-to-analog converter 71 is triggered by the pulse provided on the LOAD line from the control circuit 25. The converter 71 converts the count of the counter 69 to an analog error signal which is used for controlling a variable capacitor 73 which is coupled to the cavity 23, whereby the resonant frequency of the cavity may be slightly varied for correction thereof. The output of the converter 71, whose waveform is shown in line E of FIG. 9 reduces the frequency offset between the resonant frequency of the cavity and the carrier frequency $\omega_H$ of the injected signal.

It will be noted that production of the cavity error signal is periodically inhibited during states T1, T2, and T5 of the control cycle and that the oscillator error signal is produced only during the inhibition periods.

In summary, in the disclosed passive maser, a frequency-modulated signal interrogates the line of the stimulated emissions from the hydrogen and the resonance curve of the cavity in order respectively to provide for control of the oscillator by the stimulated emission and control of the resonance frequency of the cavity by the carrier frequency derived from the oscillator. The adverse effects of "cavity pulling" are virtually eliminated in this maser.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A process for controlling a passive maser having a resonant cavity which contains a medium capable of stimulated emission, and which is excited by an injected signal, comprising the steps of:

producing from a signal picked off from the cavity a first error signal representing the difference between the carrier frequency of the injected signal and the frequency of the stimulated emission;

using the first error signal to adjust the carrier frequency;

producing from the picked-off signal a second error signal representing the difference between the resonance frequency of the cavity and the said carrier frequency; and using the second error signal to adjust the resonance frequency, wherein production of the second error signal is periodically inhibited and that the first error signal is produced only during the inhibition periods, and wherein the step of producing a first error signal includes comparing a signal that preserves the phase of the signal picked off from the cavity to a reference signal to produce a third signal whose pulse width represents their phase difference;

gating a counter with the third signal; and converting the count of the counter to an analog signal.

2. A process for controlling a passive maser having a resonant cavity which contains a medium capable of stimulated emission, and which is excited by an injected signal, comprising the steps of:

producing from a signal picked off from the cavity a first error signal representing the difference between the carrier frequency of the injected signal and the frequency of the stimulated emission;

using the first error signal to adjust the carrier frequency;

producing from the picked-off signal a second error signal representing the difference between the resonance frequency of the cavity and the said carrier frequency; and using the second error signal to adjust the resonance frequency, wherein production of the second error signal is periodically inhibited and the first error signal is produced only during the inhibition periods, and the carrier frequency of the injected signal is shifted alternately in one direction and in the opposite direction symmetrically during the inhibition periods, and wherein the step of producing a second error signal includes detecting the beat signal of the components of the signal picked off from the cavity;

comparing the beat signal to a reference signal to produce a third signal whose pulse width represents their phase difference;

gating a counter with the third signal; and converting the count of the counter to an analog signal.

3. A passive maser comprising;

a resonant cavity for containing a medium capable of stimulated emission;

means for injecting into the cavity a signal with a carrier frequency substantially equal to the natural frequency of the stimulated emission;

means responsive to a signal which is picked off from the cavity for producing a first error signal representing the difference between the carrier frequency and the frequency of the stimulated emission;

means responsive to the first error signal for adjusting the carrier frequency;

means responsive to the signal picked off from the cavity for producing a second error signal representing the difference between the resonant frequency of the cavity and the carrier frequency;

means responsive to the second error signal for adjusting the resonance frequency of the cavity; and means for periodically inhibiting the means which produces the second error signal and enabling, only during the inhibition periods, the means which produces the first error signal, wherein the first error signal-producing means includes:

a phase comparator for comparing a signal that preserves the phase of the signal picked off from the cavity to a reference signal to produce an output signal whose pulse width represents their phase difference;

a counter connected to the phase comparator and gated by the output signal of the phase comparator; and a digital-to-analog converter connected to the counter for converting the count of the counter to an analog signal forming the first error signal.

4. A passive maser comprising: A resonant cavity for containing a medium capable of stimulated emission;

means for injecting into the cavity a signal with a carrier frequency substantially equal to the natural frequency of the stimulated emission;

means responsive to a signal which is picked off from the cavity for producing a first error signal representing the difference between the carrier frequency and the frequency of the stimulated emission;

means responsive to the first error signal for adjusting the carrier frequency;

means responsive to the signal picked off from the cavity for producing a second error signal representing the difference between the resonant frequency of the cavity and the carrier frequency;

means responsive to the second error signal for adjusting the resonance frequency of the cavity; and means for periodically inhibiting the means which produces the second error signal and enabling, only during the inhibition periods, the means which produces the first error signal, wherein the second error signal-producing means includes:

an amplitude detector for detecting the beat signal of the components of the signal picked off from the cavity;

a phase comparator connected to the amplitude detector for comparing the beat signal to a reference signal to produce an output signal whose pulse width represents their phase difference;

a counter connected to the phase comparator and gated by the output signal of the phase comparator; and a digital-to-analog converter connected to the counter for converting the count of the counter to an analog signal forming the second error signal.

5. A passive maser comprising:

a resonant cavity for containing a medium capable of stimulated emission;

means for injecting into the cavity a signal with a carrier frequency substantially equal to the natural frequency of the stimulated emission;

means responsive to a signal which is picked off from the cavity for producing a first error signal representing the difference between the carrier frequency and the frequency of the stimulated emission;

means responsive to the first error signal for adjusting the carrier frequency;

means responsive to the signal picked off from the cavity for producing a second error signal representing the difference between the resonant frequency of the cavity and the carrier frequency;

means responsive to the second error signal for adjusting the resonance frequency of the cavity; and means for periodically inhibiting the means which produces the second error signal and enabling, only during the inhibition periods, the means which produces the first error signal, wherein the first error signal-producing means includes a phase comparator for comparing a signal that preserves the phase of the signal picked off from the cavity to a reference signal to produce an output signal whose pulse width represents their phase difference.

6. The passive maser recited in claim 5 wherein the first error signal-producing means includes:
a counter connected to the phase comparator and gated by the output signal of the phase comparator.

7. A passive maser comprising:
a resonant cavity for containing a medium capable of stimulated emission;
means for injecting into the cavity a signal with a carrier frequency substantially equal to the natural frequency of the stimulated emission;
means responsive to a signal which is picked off from the cavity for producing a first error signal representing the difference between the carrier frequency and the frequency of the stimulated emission;
means responsive to the first error signal for adjusting the carrier frequency;
means responsive to the signal picked off from the cavity for producing a second error signal representing the difference between the resonant frequency of the cavity and the carrier frequency;
means responsive to the second error signal for adjusting the resonance frequency of the cavity; and
means for periodically inhibiting the means which produces the second error signal and enabling, only during the inhibition periods, the means which produces the first error signal,
wherein the second error signal-producing means includes an amplitude detector for detecting the beat signal of the components of the signal picked off from the cavity.

8. The passive maser recited in claim 7 wherein the second error signal-producing means includes:
a phase comparator connected to the amplitude detector for comparing the beat signal to a reference signal to produce an output signal whose pulse width represents their phase difference.

9. The passive maser recited in claim 8 wherein the second error signal-producing means includes:
a counter connected to the phase comparator and gated by the output signal of the phase comparator.

10. A process for controlling a passive maser having a resonant cavity which contains a medium capable of stimulated emission, and which is excited by an injected signal, comprising the steps of:
producing from a signal picked off from the cavity a first error signal representing the difference between the carrier frequency of the injected signal and the frequency of the stimulated emission;
using the first error signal to adjust the carrier frequency;
producing from the picked-off signal a second error signal representing the difference between the resonance frequency of the cavity and the said carrier frequency; and
using the second error signal to adjust the resonance frequency,
wherein production of the second error signal is periodically inhibited and that the first error signal is produced only during the inhibition periods, and wherein the step of producing a first error signal includes comparing a signal that preserves the phase of the signal picked off from the cavity to a reference signal to produce a third signal whose pulse width represents their phase difference.

11. The process for controlling a passive maser recited in claim 10 wherein the step of producing a first error signal includes:
gating a counter with the third signal.

12. A process for controlling a passive maser having a resonant cavity which contains a medium capable of stimulated emission, and which is excited by an injected signal, comprising the steps of:
producing from a signal picked off from the cavity a first error signal representing the difference between the carrier frequency of the injected signal and the frequency of the stimulated emission;
using the first error signal to adjust the carrier frequency;
producing from the picked-off signal a second error signal representing the difference between the resonance frequency of the cavity and the carrier frequency; and
using the second error signal to adjust the resonance frequency,
wherein production of the second error signal is periodically inhibited and the first error signal is produced only during the inhibition periods, and the carrier frequency of the injected signal is shifted alternately in one direction and in the opposite direction symmetrically during the inhibition periods, and wherein the step of producing a second error signal includes detecting the beat signal of the components of the signal picked off from the cavity.

13. The process for controlling a passive maser recited in claim 12 wherein the step of producing a second error signal includes:
comparing the beat signal to a reference signal to produce a third signal whose pulse width represents their phase difference.

14. The process for controlling a passive maser recited in claim 13 wherein the step of producing a second error signal includes:
gating a counter with the third signal.

* * * * *